(12) United States Patent
Wang et al.

(10) Patent No.: US 7,301,645 B2
(45) Date of Patent: Nov. 27, 2007

(54) IN-SITU CRITICAL DIMENSION MEASUREMENT

(75) Inventors: Shiang-Bau Wang, Taoyuan (TW); Yuan-Hung Chiu, Taipei (TW); Hun-Jan Tao, Hsin Chu (TW); Chao-Tzung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 196 days.

(21) Appl. No.: 11/053,300

(22) Filed: Feb. 7, 2005

(65) Prior Publication Data

US 2006/0046323 A1  Mar. 2, 2006

Related U.S. Application Data

(60) Provisional application No. 60/606,080, filed on Aug. 31, 2004.

(51) Int. Cl.
  *G01B 11/02* (2006.01)
(52) U.S. Cl. ..................................... 356/503
(58) Field of Classification Search ............ 356/503, 356/504, 632
  See application file for complete search history.

(56) References Cited

U.S. PATENT DOCUMENTS

| | | | |
|---|---|---|---|
| 4,128,670 A * | 12/1978 | Gaensslen | ............... 438/592 |
| 5,450,205 A * | 9/1995 | Sawin et al. | ............. 356/632 |
| 5,926,690 A | 7/1999 | Toprac et al. | |
| 6,388,253 B1 | 5/2002 | Su | |
| 6,423,457 B1 | 7/2002 | Bell | |
| 6,625,512 B1 | 9/2003 | Goodwin | |
| 6,630,361 B1 | 10/2003 | Singh et al. | |
| 6,645,780 B1 | 11/2003 | Sonderman et al. | |

OTHER PUBLICATIONS http://www.fabtech.org/site-yieldmanagement/news/2001/08/08/03.shtml on May 13, 2004, 2 pages.

* cited by examiner

*Primary Examiner*—Michael A. Lyons
(74) *Attorney, Agent, or Firm*—Duane Morris LLP

(57) ABSTRACT

A method of monitoring a critical dimension of a structural element in an integrated circuit is provided comprising the following steps: collecting an optical interference endpoint signal produced during etching one or more layers to form the structural element; and determining based upon the optical interference endpoint signal the critical dimension of the structural element.

20 Claims, 11 Drawing Sheets

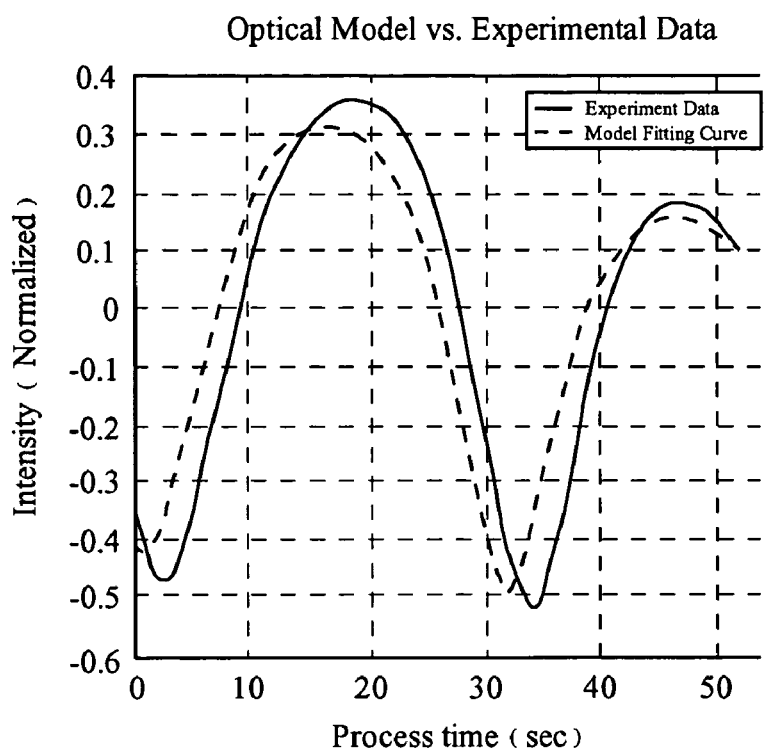
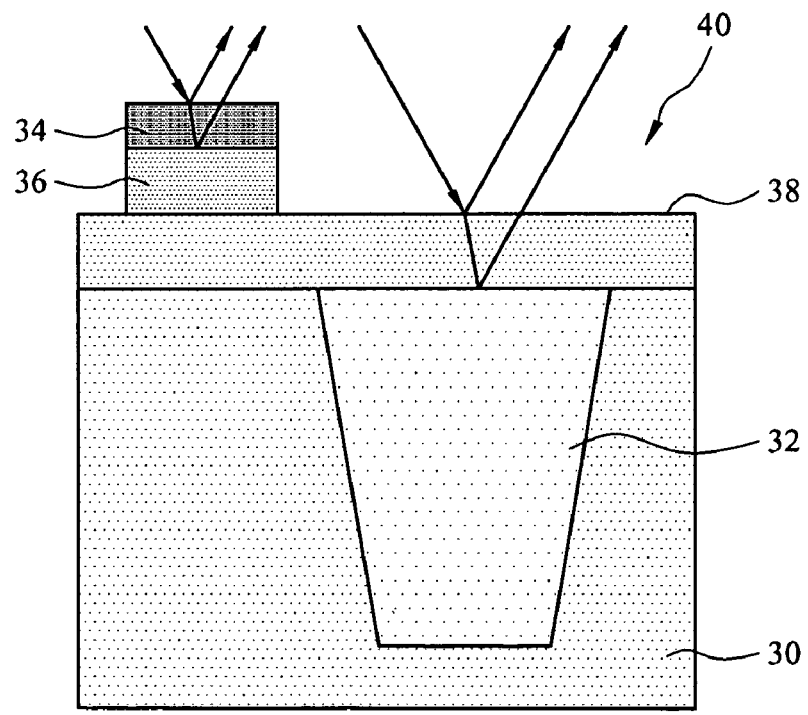
FIG. 3 ( c )

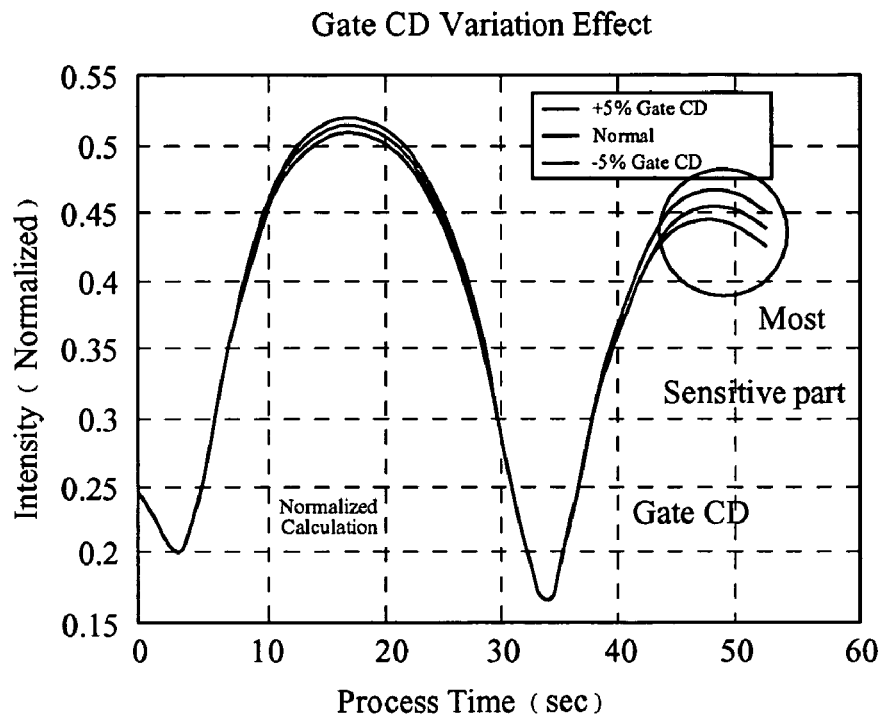
FIG. 4 ( a )
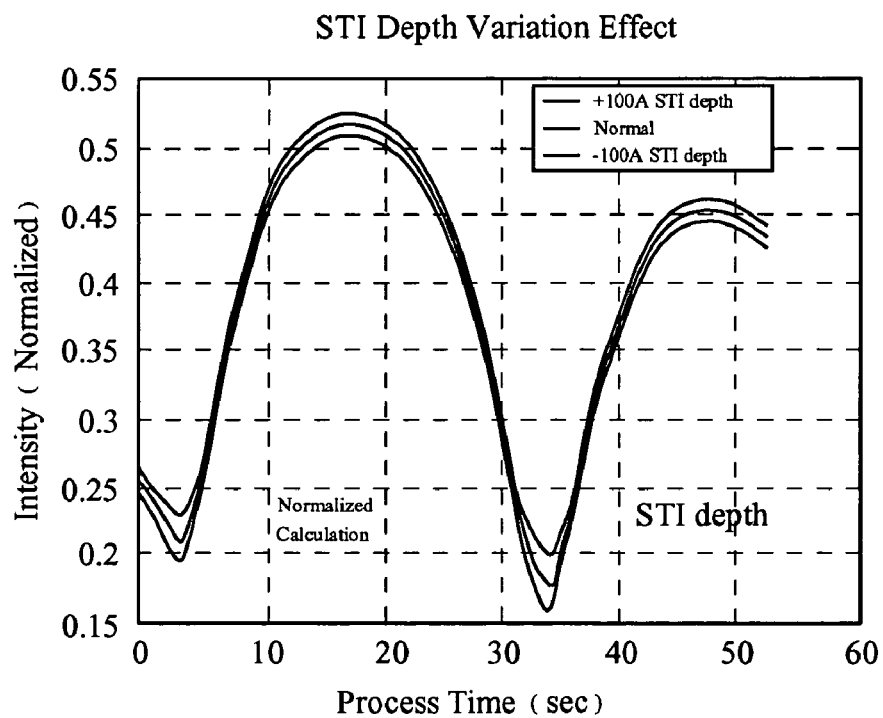
FIG. 4 ( b )

US 7,301,645 B2

IN-SITU CRITICAL DIMENSION MEASUREMENT

CROSS-REFERENCE TO RELATED APPLICATION

This application claims priority to U.S. Provisional Application No. 60/606,080 filed Aug. 31, 2004, entitled "In-Situ Critical Dimension Measurement", the entirety of which is hereby incorporated by reference herein.

FIELD OF THE INVENTION

The present invention relates to integrated circuit manufacturing, and more specifically to methods of monitoring and determining critical dimensions of manufactured integrated circuits.

BACKGROUND OF THE INVENTION

Critical dimension control is important in integrated circuit manufacturing processes, particularly with respect to gate critical dimensions, which impact transistor performance. Controlling critical dimensions is becoming increasingly important as dimensions of gate elements, such as polysilicon gate elements, fall within the deep sub-micron range. Gate dimensions generally need to be controlled to within 2-3% of the target dimension. In 90 nm devices, the run-to-run gate critical dimension variation is required to be controlled to within 2-3 nm. For anticipated 65 nm devices, acceptable gate critical dimension variation is even smaller. Therefore, accurate monitoring of critical dimensions is of increasing importance in the industry.

Presently, critical dimensions are determined by actually measuring line widths of sampled wafers outside of the process that determines the critical dimension. Measurements on a sample wafer are typically taken by a separate scanning electron beam (SEM) metrology tool. A wafer is removed from the manufacturing process and its critical dimensions are then measured using the tool. The wafer can then be returned to the manufacturing process. This method, however, is slow, requires additional expensive hardware, requires significant additional processing steps and can cause so called "e-beam" damage to layers formed on the wafer. Further, the accuracy of these SEM techniques may not be sufficient for newer generations of integrated circuits (e.g., 65-90 nm devices).

In some processes, a separate optical tool is used to measure critical dimension. However, this methodology is also performed by a separate tool after etch processing and requires formation of grating structures on the wafer, oblique angle light sources, high clean surfaces and the use of complicated mathematical models to determine critical dimension.

Therefore, there is a need for a non-destructive method of in-situ measuring critical dimensions of features of integrated circuits. Still further, there remains a need to provide for in-situ measurement of critical dimensions without costly hardware additions or upgrades.

SUMMARY OF THE INVENTION

A method of monitoring a critical dimension of a structural element in an integrated circuit is provided comprising the following steps: collecting an optical interference endpoint signal produced during etching one or more layers to form the structural element; and determining based upon the optical interference endpoint signal the critical dimension of the structural element.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
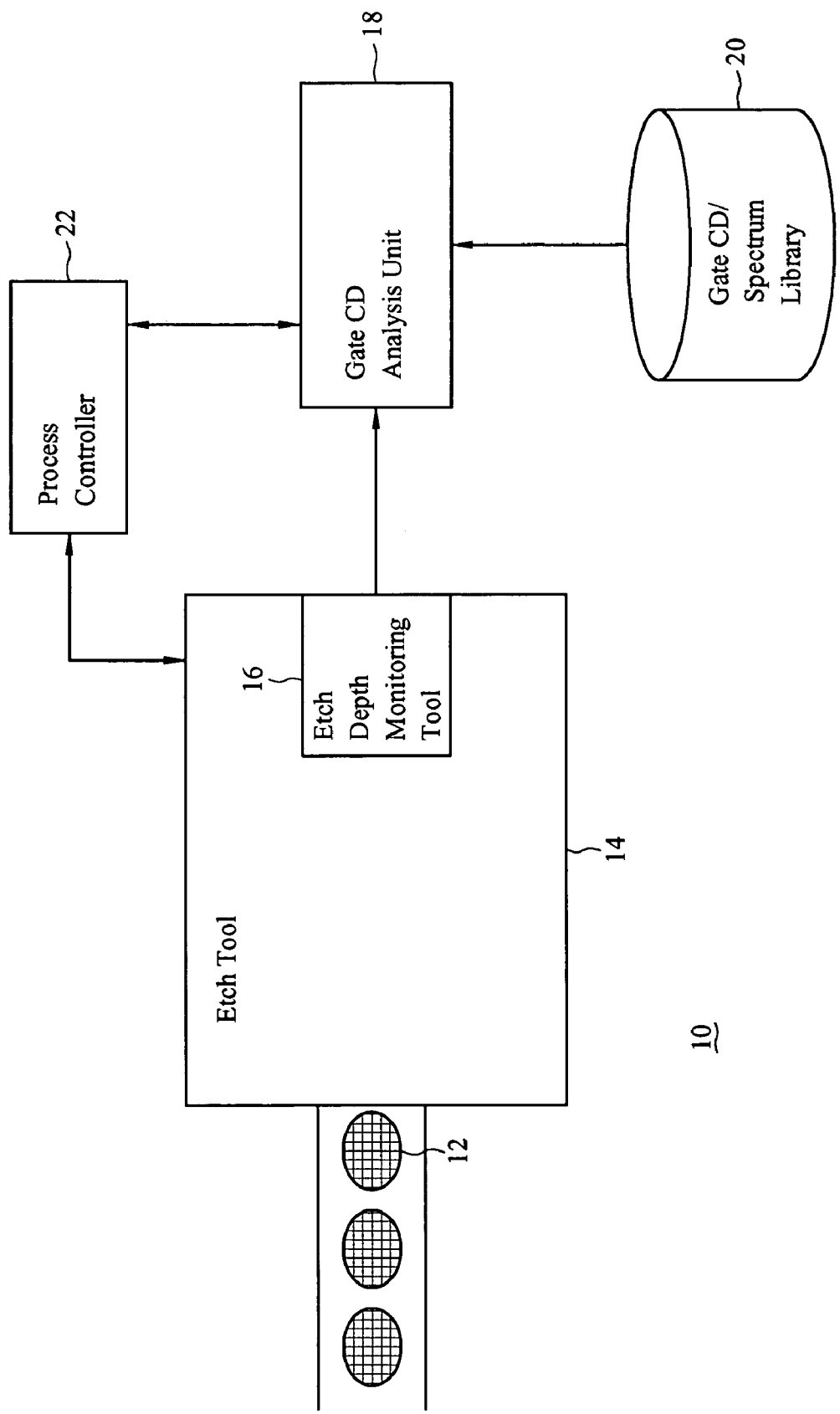
FIG. 1 is a schematic illustration of a system for in-situ monitoring of critical dimensions in an integrated circuit manufacturing system.

FIG. 1 is a schematic illustration of a system 10 for in-situ monitoring of critical dimensions (CD) in an integrated circuit (IC) manufacturing system and process, and more specifically, for monitoring critical dimensions of structural elements in an integrated circuit, such as gate elements, and run-to-run critical dimension variation of integrated circuits. Typically, the smallest widths for elements of a structure are known as critical dimensions or "CD". By "gate critical dimension" or "critical dimension of the gate" it is meant the gate width that determines the channel size of a field effect transistor (FET). As described in more detail below, in one embodiment, the in-situ determination and monitoring technique take advantage of hardware that is already utilized in tools used in the IC manufacturing process and data collected thereby. In this embodiment, the new metrology technique advantageously requires no costly, or minimal, hardware and software upgrades or additions.

Although the method and system described herein are illustrated hereafter in connection with monitoring of gate critical dimensions and collection of interferometry data during a polysilicon etch process for formation of a gate element, the method and system may also be used to monitor and determine critical dimensions of other structural elements in an integrated circuit formed via an etch process, such as but not limited to interconnect lines and vias, trenches, and contacts.

The manufacturing system 10 includes an etch tool 14, such as a series LAM 2300 etch tool available from LAM Research Corp. of Fremont, Calif., for performing the gate etch process to form the gate electrodes (e.g., polysilicon gate electrode) of the transistors of the integrated circuits formed on wafers 12. The etch tool 14 includes a built in metrology tool, labeled Etch Depth Monitoring Tool 16, that is used to collect an interference signal indicative of the etch depth of the polysilicon layer during the polysilicon main etch process. In one embodiment, the tool 16 includes a light source, at an angle generally normal to the wafer surface, and one or more photodetectors for detecting light reflected off of the wafer surface proximate to and including the etch region during the main etch step. In the typical polysilicon etch monitoring process, the optical signal collected by the tool 16 is used to develop an optical interferometry signal that oscillates because of the phase difference between the signal reflected off of the top of the polysilicon layer and the signal reflected off of the etched region of the polysilicon layer. The interference signal has a continuously varying peak amplitude during the etch process because of the change in the depth of the etch region as the etch process proceeds over time. When an endpoint signal is recognized by the system, i.e., an interference signal known to correspond to a desired etch depth, the process controller 22 stops the etch process.

In the system of FIG. 1, the optical signal detected by etch tool 16 for etch depth control purposes is utilized to additionally monitor gate critical dimension. No additional hardware within etch tool 14 or metrology tool 16 is required, although a separate metrology tool (not shown) may certainly be included within etch tool 14 for this purpose.

Figure 2:
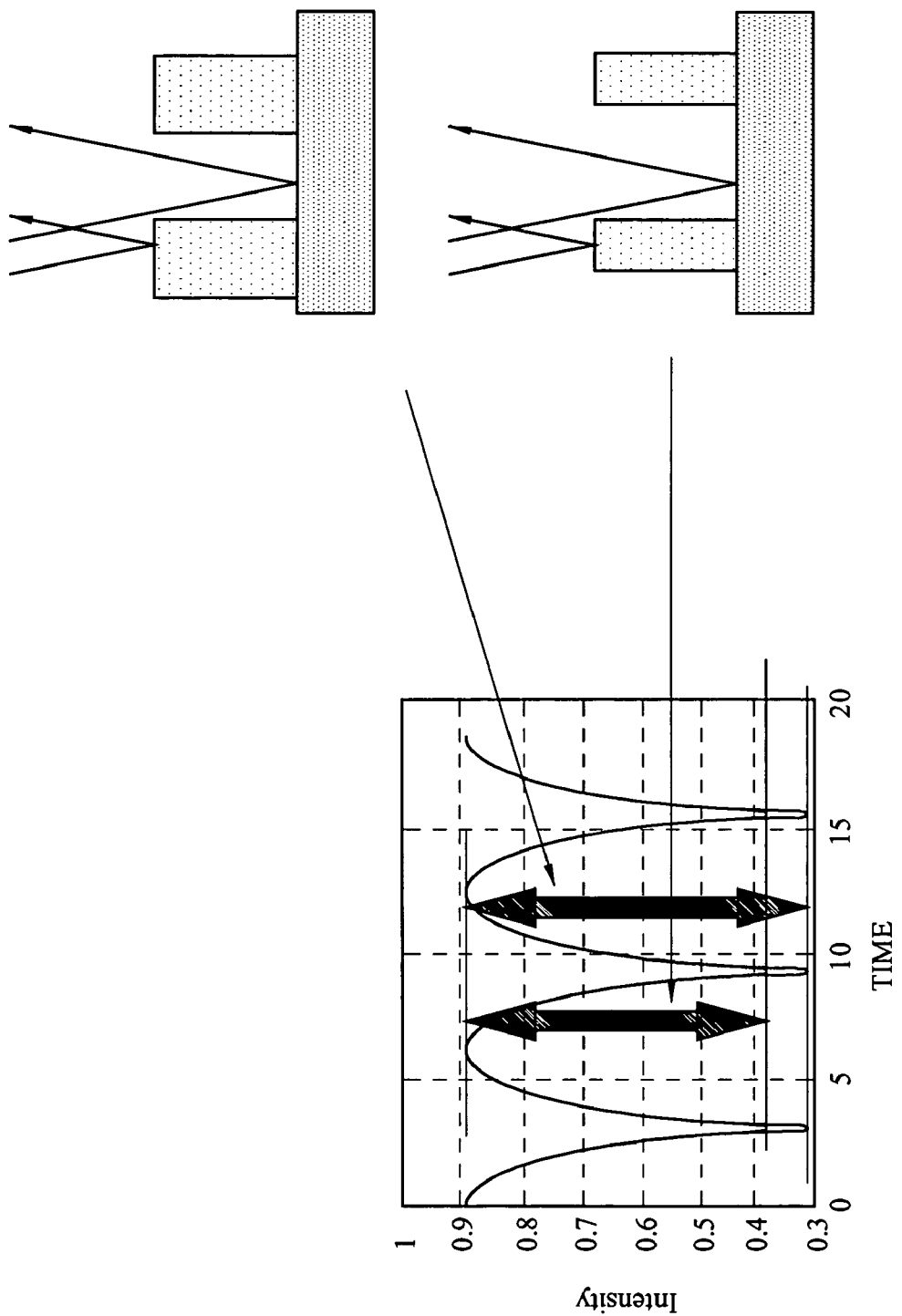
FIG. 2 is an illustration showing the change in an interference signal generated from two regions including gate elements having different critical dimensions.

The inventors have recognized that when the critical dimension of the gate element is varied, the reflection ratio between light reflected off of the top surface of the gate element and the light reflected off of the etched areas differ, i.e., the peak-to-peak height of the respective oscillating interferometry signals differ. The total exposure area on the wafer does not change, but the reflected light intensities from the polysilicon gate surface and the other surfaces of the wafer do change. This phenomena is illustrated in FIG. 2. Because of this phenomena, the critical dimension can be monitored by observing the ratio of the area of the polysilicon gate surface, which is the same as the area of the hard mask (typically SiON) formed over the polysilicon layer, during etch relative to the total exposed area. Focusing on the area ratios allows for determination of the critical dimension of the gate element even though the actual topography of the wafer surface is complicated and the reflected light is contributed by at least six interfaces, i.e., the air and hard mask interface, the air and polysilicon interface, the polysilicon and trench oxide interface, the trench oxide and silicon wafer interface, the hard mask and polysilicon interface and the polysilicon and gate oxide interface.

Figure 3:
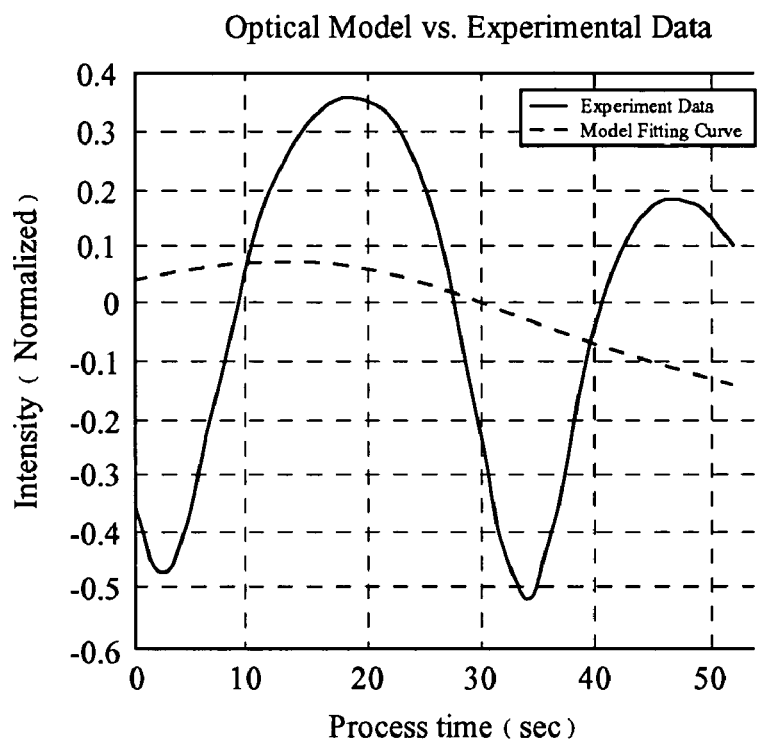
FIGS. 3(a)-3(d) show illustrations of various interfaces that contribute to reflected light in an interference signal and corresponding graphs illustrating a comparison of the computed contribution of the respective interfaces to a total detected interference signal.
Figure 3:
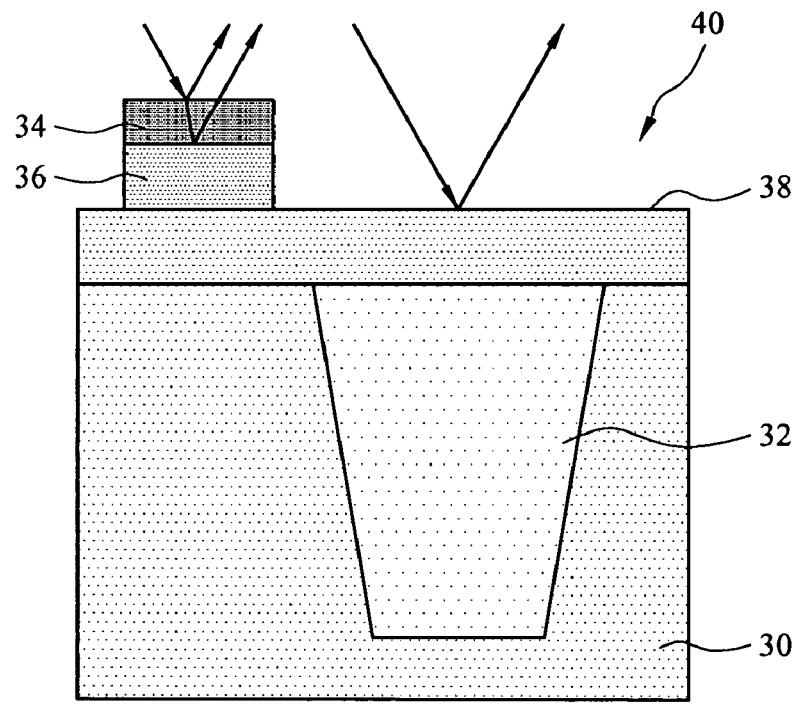
Figure 3:
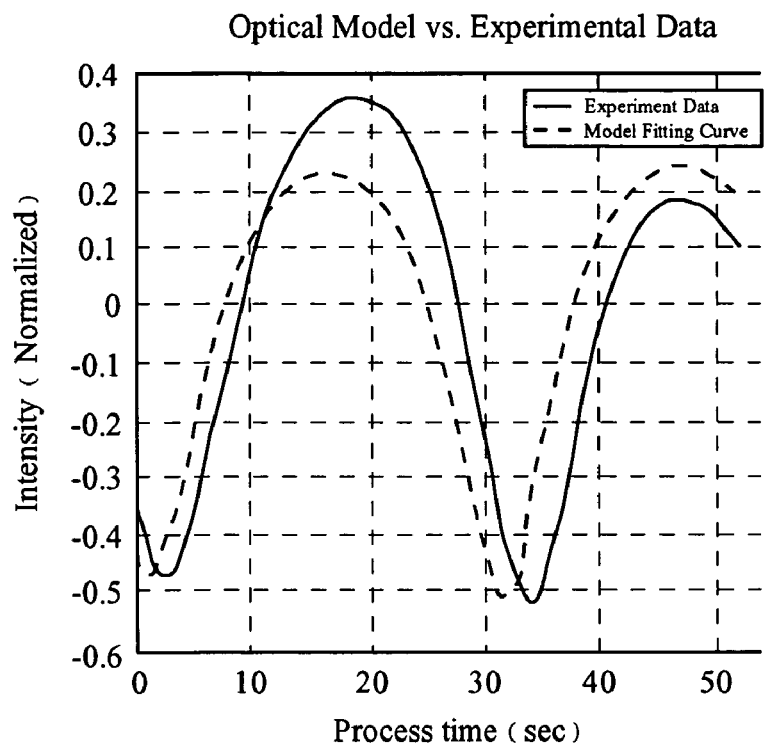
Figure 3:
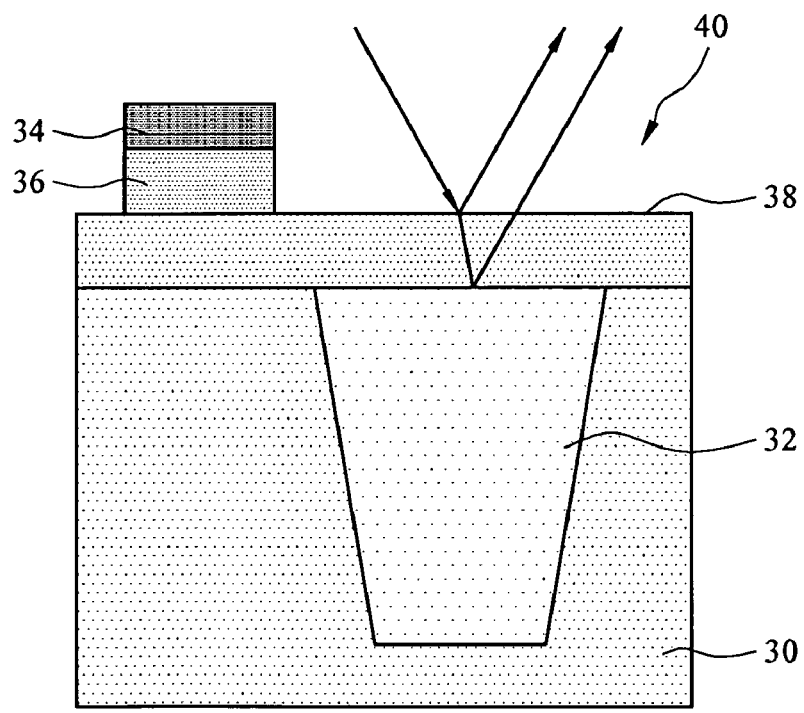
Figure 3:
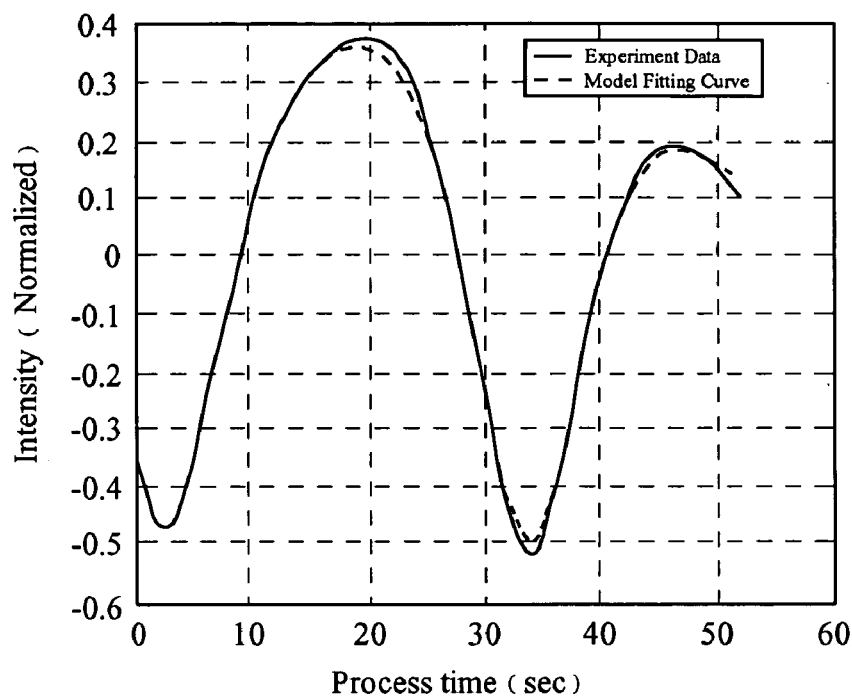
Figure 3:
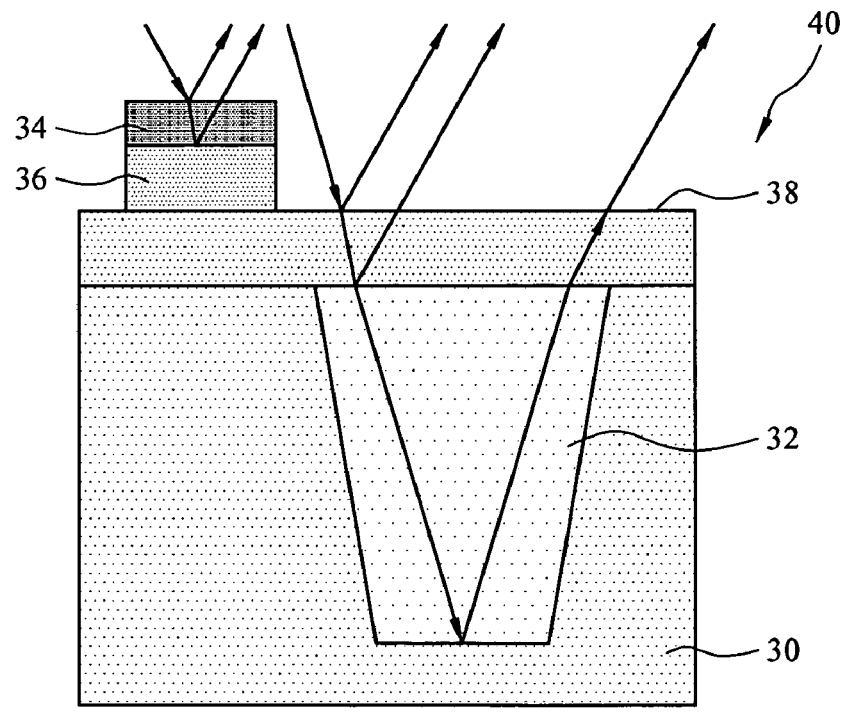

The comparison graphs of FIGS. 3(*a*)-3(*d*) were generated to confirm that the interference signal detected during the polysilicon etch process contains reflection information from the various interfaces and that the gate also contributes to the total interference signal envelope. Each of FIGS. 3(*a*)-3(*d*) schematically illustrates light incident on specific layer interfaces and reflected therefrom as well as a graph comparing the total interference envelope measured during an actual etch process (the solid curve) and calculated reflection data for the illustrated interfaces (dashed curve). The calculated data were generated using mathematical reflectance formulas with some unknown parameters adjusted for best fit purposes. The mathematical formulas should be familiar to those in the art and are not set forth herein in order to avoid unnecessarily obscuring the disclosure. In FIGS. 3(*a*)-3(*d*), reference 30 identifies the wafer substrate; reference 32 identifies the shallow trench isolation region; reference 34 identifies the hard mask; reference 36 identifies the polysilicon gate; reference 38 identifies the polysilicon/air interface; and reference 40 identifies the air or surrounding environment separating the wafer and the light source. FIG. 3(*a*) illustrates light incident on and reflected from the air-hard mask, hard mask-polysilicon, and polysilicon-air interfaces. FIG. 3(*b*) illustrates light incident on and reflected from the polysilicon-air and polysilicon-STI oxide interface. FIG. 3(*c*) illustrates light incident on and reflected from the combined interfaces of FIGS. 3(*a*) and 3(*b*). Last, FIG. 3(*d*) illustrates light incident on and reflected from the interfaces of FIG. 3(*c*) with the addition of the interface of the STI oxide and silicon wafer. FIGS. 3(*a*)-3(*c*) confirm the hypothesis that each interface contributes to the interferometry envelope, and FIG. 3(*d*) shows good correlation between the detected total envelope and the mathematical calculation of the total envelope.

Figure 4:
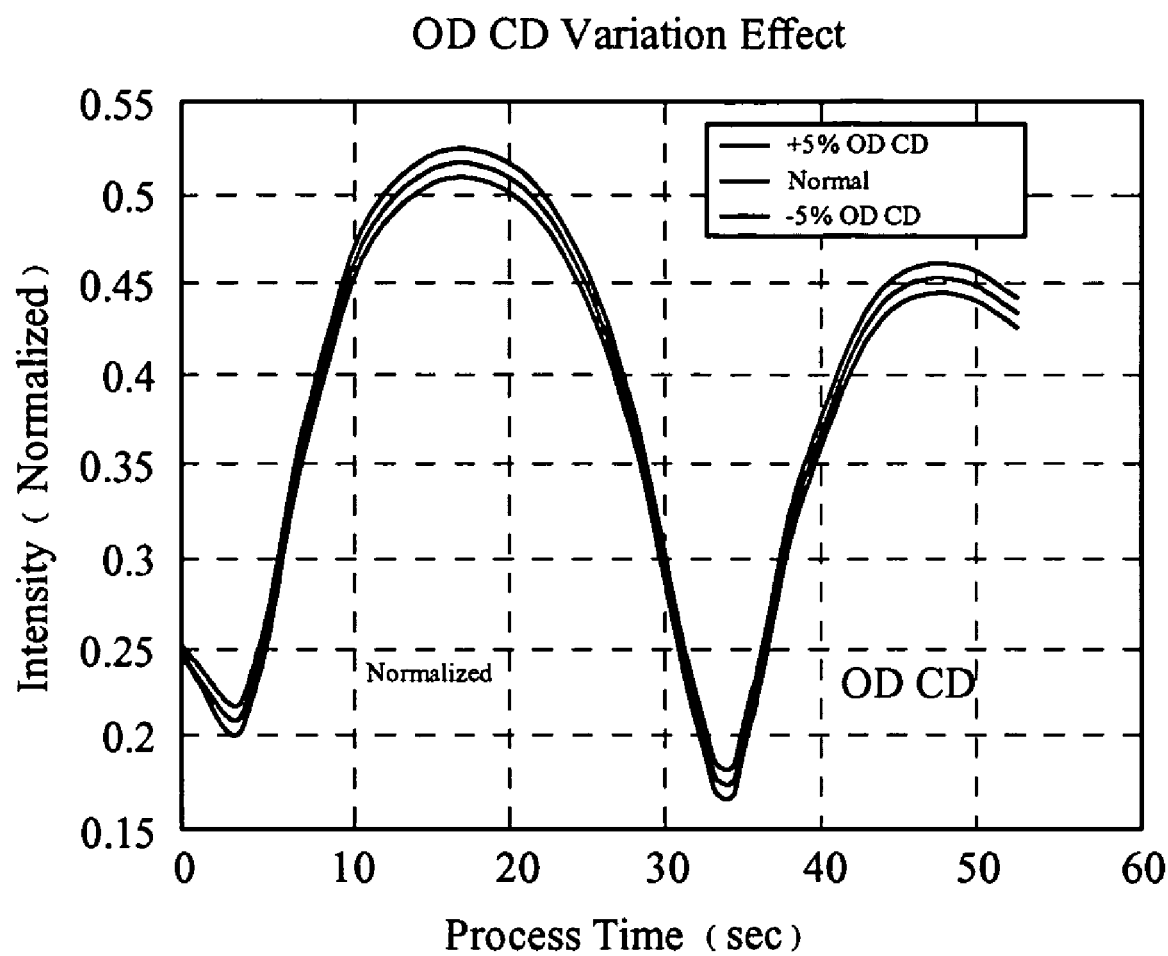
FIGS. 4(a)-4(c) illustrate the effects of gate critical dimension variation, isolation regions dimension variation and active area dimension variation, respectively, on the interferometry signal.

As noted above, it is recognized that the various interfaces contribute to the total interference envelope. However, the contribution of the interfaces reflective of the gate width (i.e., gate critical dimension) is the portion of the envelope that is of interest for gate critical dimension determination and must be isolated. In FIGS. 4(*a*)-4(*c*), calculated interference signal simulation data were plotted for various regions of an integrated circuit. FIG. 4(*a*) plots the simulated interference signals detected for three scenarios—(i) the gate CD is at the target value; (ii) the gate CD is +5% of the target value; and (iii) the gate CD is −5% of the target value. FIGS. 4(*b*) and 4(*c*) provide similar plots, respectively, for variation in the STI depth and OD area (oxide defined area, i.e., the area excluding the STI area). The graphs indicate that the interferometry data collected during the main polysilicon etch process (the progression of which is indicated by the time axis (X-axis) of the graphs) change with changes in gate CD, STI depth and OD CD. However, only the gate CD graph of FIG. 4(*a*) illustrates a discernible difference between peaks of each depicted oscillating interference signal. FIG. 4(*a*) illustrates that the change in critical dimension of the gate element has a larger effect on the second peak amplitude than it does the first peak amplitude, i.e., the second peak amplitude is more sensitive to changes in critical dimension than the first peak amplitude. The same cannot be said for the curves of FIGS. 4(*b*) and 4(*c*), which indicate that changes in monitored critical dimensions have substantially the same effect on the first and second peak amplitudes. FIG. 4(*a*), therefore, illustrates that observation of the second peak of the interference signal, such as the difference between the amplitude of the second peak and the first peak and/or trough between the first and second peaks or even another portion of the interface signal, can provide information indicative of gate critical dimension. Observing this difference effectively eliminates the contributions of variations in STI depth and OD CD in the analysis.

It is also recognized that the initial polysilicon thickness and etch rate for each wafer can vary. Indeed, this is a factor in using interferometry to determine arrival at the desired etch endpoint rather than relying solely on process parameters, such as etch time. Because etch rates may vary, the interference signals detected for the same critical dimension but with different initial polysilicon thicknesses can be out of phase. For this reason, in order to avoid the effect of polysilicon thickness on the detected interferometry spectrum, the signal can be normalized based on a pre-measured polysilicon from the polysilicon deposition process. Normalization is desired because the peak amplitude will vary for different polysilicon thicknesses because reflected light intensity decays in the polysilicon thickness. The intensity decrease can be corrected or accounted for by establishing a relational database of amplitude vs. polysilicon thickness. Calculations have revealed that thickness variations in the hard mask formed over the polysilicon layer have a negligible effect on the interferometery signal but this thickness could also be considered if desired.

Referring again to FIG. 1, the optical spectrum is detected by the in-situ metrology tool 16 and converted to an electrical interferometry signal containing interferometry data. The interferometry data corresponding to the signal are provided to the Gate CD Analysis Unit 18, which is essentially a programmed processor. The Analysis Unit 18 is programmed to perform any pre-comparison processing necessary for normalizing the signal prior to determining the critical dimension, for example for the etch rate and/or polysilicon thickness compensation. The detected signal is then compared by the Analysis Unit 18 against data in a Gate Critical Dimension Spectrum Library 20. For example, the difference between the peak amplitude of the first peak and second peak, or the first peak and the trough between the first and second peaks, of the detected (and possibly normalized) interference signal can be determined and compared against a dataset of peak difference values correlated to known or calculated critical dimensions of gate elements. In this manner, the critical dimension of the gate element can be detected while the wafer 12 is still in the manufacturing process using existing interference data and without resorting to destructive, time consuming and/or expensive metrology practices, such as SEM.

The database 20 can be populated in several different ways. The data can be generated using mathematical models, i.e., simulation data. The data can also be generated by recording interference data followed by performing CD analysis using conventional techniques, such as SEM. The interference data can then be correlated to the CD determined using the conventional technique in order to populate the database.

Figure 5:
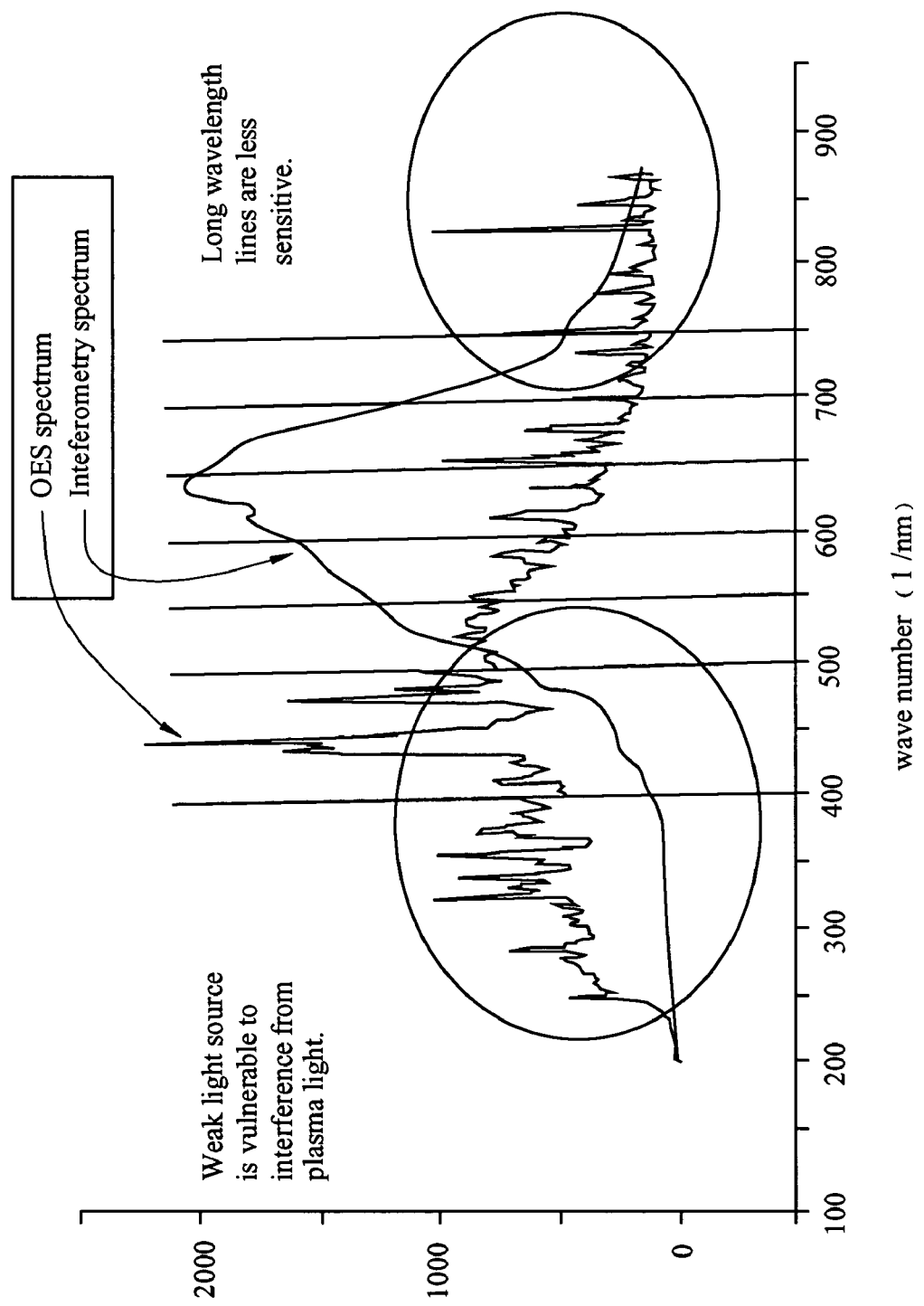
FIG. 5 is a graph comparing the optical emission spectrum verses interferometry spectrum.

FIG. 5 is a plot comparing the interferometry spectrum with the Optical Emission Spectrum. The interferometry spectrum is the light source spectrum while the Optical Emission Spectrum represents the plasma spectrum. Ideally, the intensity ratio of the light source to plasma emission is as high as possible to prevent noise. The graph of FIG. 5, generated from experimental data, indicates that light signals with lower wavelengths are vulnerable to interference from plasma light, i.e., light generated when the plasma in the etch chamber is ignited. In actual use, the interferometry signal has components that are provided by both the interferometry light source as well as the plasma light. Ideally, the interferometry signal would be the only light detected, but practically a light source should be selected to have less sensitivity to plasma light noise. This selected wavelength can be isolated from the interference spectrum using the photodetector(s) as filters and/or other optical and/or electrical filters for isolation of a desired wavelength. A comparison of the peak height of each signal at each wavelength in FIG. 5 indicates that wavelengths under about 500 nm have intensities that are too weak to prevent plasma influence and higher wavelength lines are less sensitive to interference, particularly between about 550-700 nm, although in some applications, wavelengths between about 400-800 nm may be appropriate.

Figure 6:
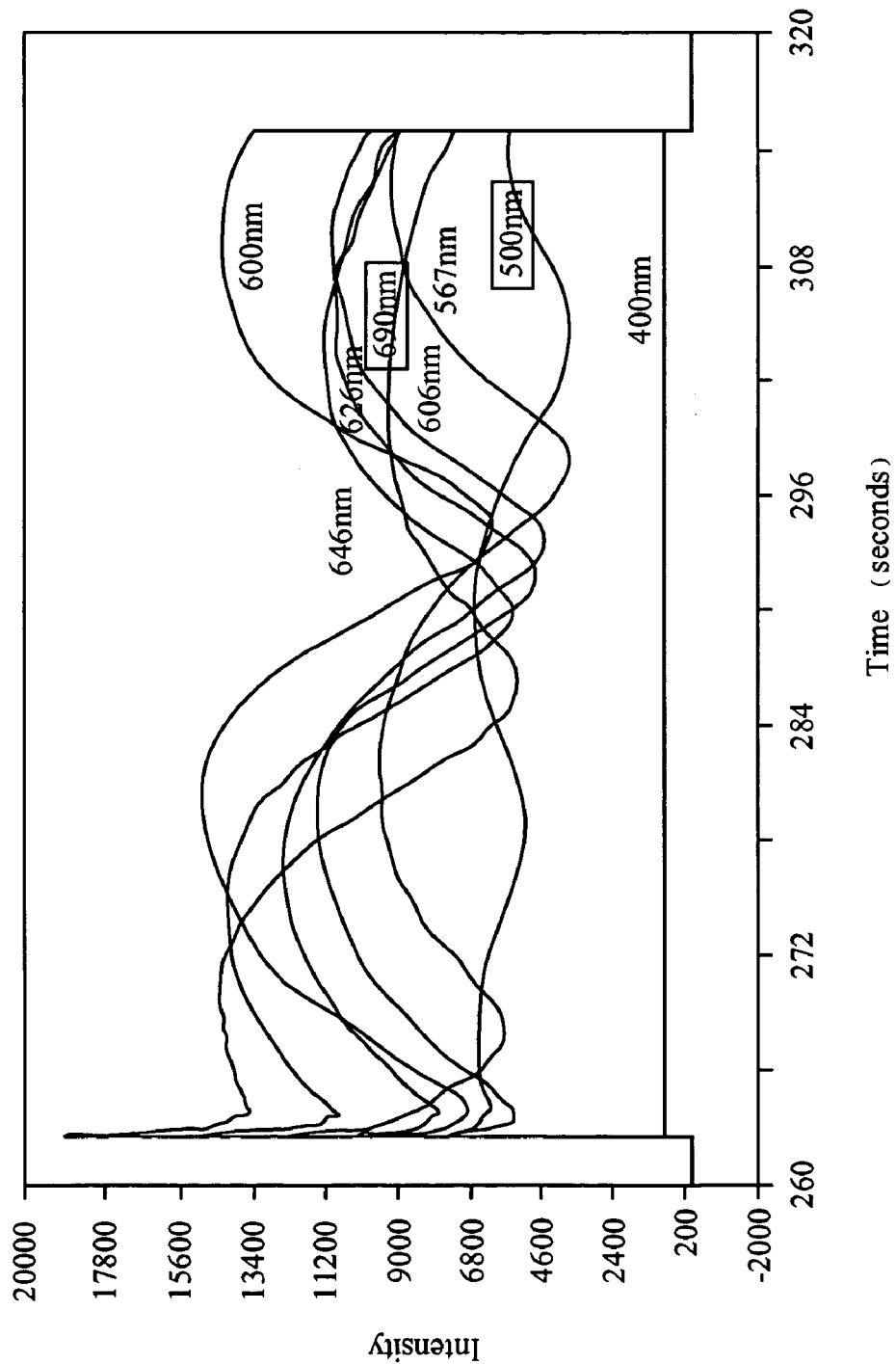
FIG. 6 is a graph showing an interferometry signal for various selected wavelengths for optical sources.

The wavelength of the light source in metrology unit 16 is preferably selected in a range that has the least interference from plasma light and provides the strongest intensity in the light source. It is also possible to use more than one wavelength for monitoring and determining critical dimension. For example, the light source may provide a broad band spectrum of light signals. Preferred wavelengths can be collected and analyzed to perform the critical dimension estimation. Critical dimension information derived from each wavelength can be checked against one another as a control, averaged or otherwise used to determine critical dimensions. FIG. 6 is a graph of measured interference signals plotted to show the first two peaks. The 567 to 690 nm signals exhibit large envelope variation between the first and second peaks and appears to be preferred wavelengths.

Figure 7:
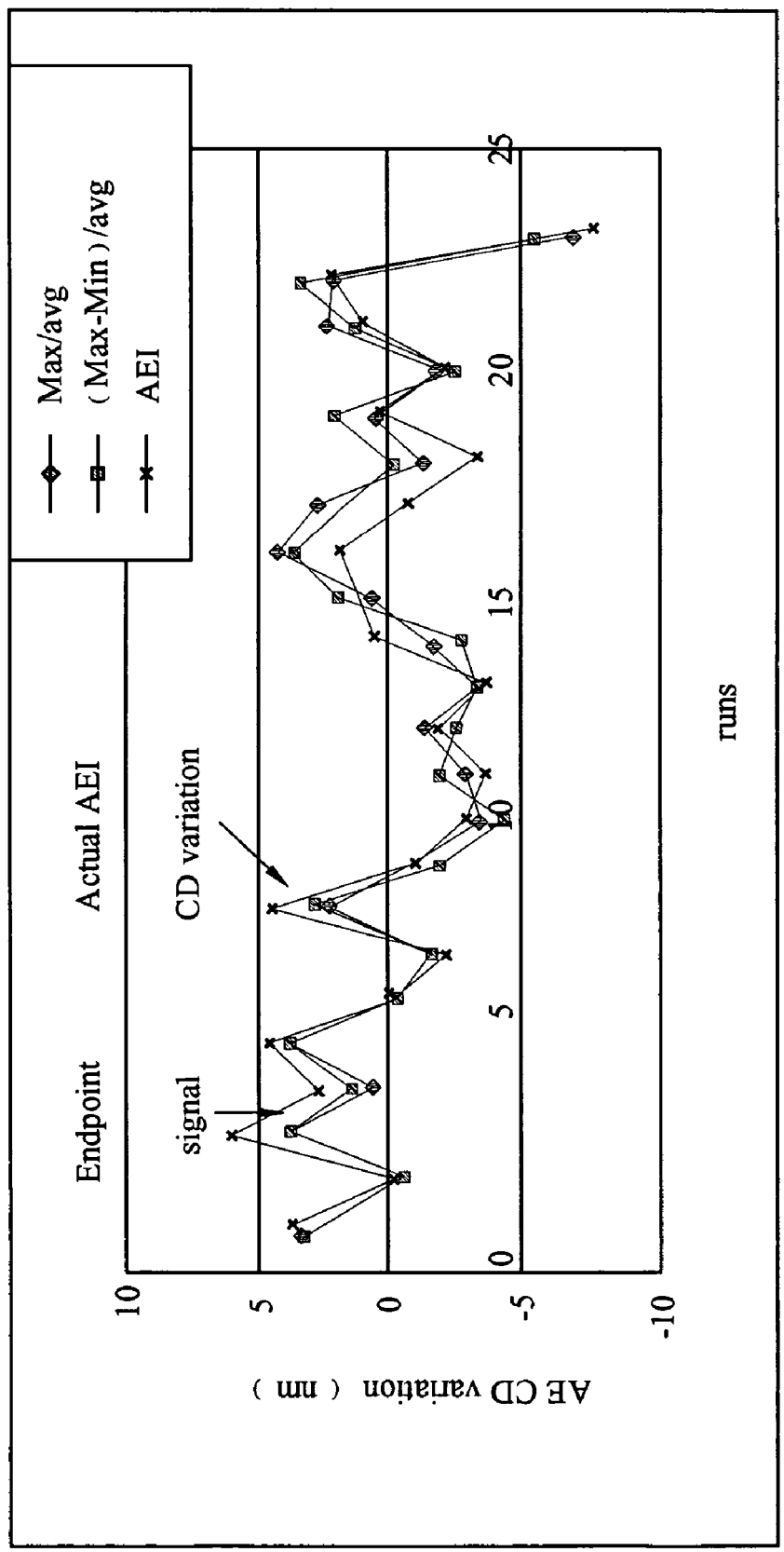
FIG. 7 is a graph illustrating the close correlation between run-to-run average critical dimension variation results determined by standard after etch inspection (AEI) techniques and the methodology described in connection with FIG. 1.

FIG. 7 illustrates a plot indicating that the in-situ CD measurement technique described above utilizing the optical endpoint interference signal generated and captured during polysilicon main etch monitoring has very good correlation to run-to-run critical dimension variation data generated using conventional after etch inspection (AEI) off line (ex-situ) techniques. The chart illustrates average critical dimension variation (Y-axis) of all tested wafers for twenty-three different process runs (X-axis). A process run utilizes one wafer per run for measurement. The data "Max/avg" represent the critical dimension values as determined by observing the second peak amplitude of the interferometry signal divided by the average value of the entire detected interferometry signal. The data "(Max-Min)/avg" represent the critical dimension values as determined by observing the difference between the second peak height and the trough between the first and second peak divided by the average value of the entire detected interferometry signal.

The critical dimension information obtained by the Analysis Unit 18 may be used by the Process Controller 22 in a feedback loop to control Etch Tool 14 to modify the etch process to control the gate critical dimension and ensure the gate critical dimension is within tolerance limits for subsequent wafers. As one of ordinary skill will recognize, gate critical dimension is usually determined by the following steps: BARC (bottom antireflective coating) opening; BARC main etch; hard mask main etch; and hard mask trim. The processing parameters for one or more of these steps performed by etch tool 14 can be modified by the Process controller 22 to bring the gate critical dimension to within tolerance.

The method and system described herein provide for an in-situ, non-destructive and cost effective technique for determining structural element critical dimensions, such as gate critical dimension. The method and system provide a means of determining critical dimension during an etch process in real-time, without the cost, time, and e-beam damage problems associated with Critical Dimension (CD) SEM. Likewise, the method and system do not require additional grating patterns or structures, strict surface cleanliness requirements, oblique incident angle light sources and the use complicated mathematical modeling associated with prior art optical critical dimension techniques.

The methodology can be extended to determine other critical dimensions, such as OD size and/or as an indirect metrology tool for determining process conditions in an etch chamber. In one embodiment, critical dimension data can be used as part of a feedback, or even feed forward, loop in controlling process parameters to ensure that device features are within tolerance.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of monitoring a critical dimension of a structural element in an integrated circuit, comprising the following steps:
   (a) collecting at least one optical interference endpoint signal produced during etching one or more layers to forms aid structural element;
   (b) determining based upon said at least one optical interference endpoint signal the critical dimension of said structural element; and
   (c) outputting the determined critical dimension of said structural element.

2. The method of claim 1, wherein said interference endpoint signal comprises an oscillating signal with a peak or trough amplitude that changes during said etching of said one or more layers, wherein the determining step comprises the step of analyzing at least one peak or trough from said oscillating signal.

3. The method of claim 2, wherein said oscillating signal has at least a first and second peaks or troughs chronologically, and said analyzing step comprises comparing said second peak or trough to another portion of said oscillating signal.

4. The method of claim 3, wherein said comparing step comprises comparing second peak to said first peak and/or to a trough defined between said first and second peaks.

5. The method of claim 1, wherein said determining step comprises comparing data retrieved from said optical interference endpoint signal against a collection of optical interference endpoint data correlated to structural element critical dimensions.

6. The method of claim 5, wherein said data retrieved from said optical interference endpoint signal are normalized to account for the thickness of said one or more layers.

7. The method of claim 1, wherein said collecting step comprises the following steps:
   illuminating with light an area including at least a portion of said one or more layers during etching thereof to form said structural element; and
   collecting reflected light from said area.

8. The method of claim 7, wherein said at least one optical interference endpoint comprises an interference signal having a wavelength, between about 550-700 nm.

9. The method of claim 1, wherein one or more layers comprises a polysilicon layer and said structural element comprises a gate element.

10. The method of claim 1, wherein, said determining and collecting steps are performed for a plurality of structural elements on a wafer for a process run, the method further comprising the step of calculating critical dimension variation for said process run.

11. The method of claim 10, further comprising controlling via a feedback loop an etch process based at least in part on said calculated critical dimension variation.

12. The method of claim 1, wherein said at least one optical interference endpoint signal comprises a plurality of optical interference endpoint signals at different wavelengths, and wherein said determining step (b) is based upon said plurality of optical interference endpoint signals.

13. A method of monitoring a dimension of a structural element in an integrated circuit, comprising the following steps:
   (a) collecting at least one optical interference endpoint signal produced during monitoring of etching one or more layers to form a structural element in said integrated circuit, wherein said interference endpoint signal comprises an oscillating signal with a peak or trough amplitude that changes during said etching of said one or more layers;
   (b) determining based upon said optical interference endpoint signal the dimension of said structural element, wherein said determining step comprises comparing data retrieved from said optical interference endpoint signal against a library of optical interference endpoint data correlated to structural element dimensions, wherein said dimension of said structural element is a width of said structural element; and
   (c) outputting the determined dimension of said structural element.

14. The method of claim 13, wherein the determining step comprises the step of analyzing at least one peak or trough from said oscillating signal.

15. The method of claim 14, wherein said oscillating signal has a plurality of peaks or troughs including at least a first and second peaks or troughs chronologically, and said analyzing step comprises comparing at least one peak or trough from said plurality of peaks or troughs to another portion of said oscillating signal.

16. The method of claim 13, wherein said data retrieved from said optical interference endpoint signal are normalized to account for the thickness of said one or more layers.

17. The method of claim 13, wherein said collecting step comprises the following steps:
   illuminating with light an area including at least a portion of said one or more layers during etching thereof to form said structural element; and
   collecting reflected light from said area.

18. The method of claim 17, wherein said at least one optical interference endpoint signal has a wavelength between about 550-700 nm.

19. The method of claim 13, wherein said at least one optical interference endpoint signal comprises a plurality of optical interference endpoint signals at different wavelengths, and wherein said determining step (b) is based upon said plurality of optical interference endpoint signals.

20. A system for monitoring a dimension of a structural element of an integrated circuit, comprising:
   (a) an etch tool comprising an etch depth monitoring tool comprising an optical source and at least one photodetector for collecting at least one optical interference endpoint signal produced during monitoring of etching one or more layers to form a structural element in said integrated circuit, wherein said at least one interference endpoint signal comprises an oscillating signal with a peak or trough amplitude that during said etching of said one or more layers; and
   (b) means for comparing data retrieved from said at least one optical interference endpoint signal against a library of optical interference endpoint data correlated to structural element dimensions, whereby said dimension is determined, wherein said dimension of the structural element is a width of said structural element.

* * * * *

UNITED STATES PATENT AND TRADEMARK OFFICE
CERTIFICATE OF CORRECTION

| | | |
|---|---|---|
| PATENT NO. | : 7,301,645 B2 | Page 1 of 1 |
| APPLICATION NO. | : 11/053300 | |
| DATED | : November 27, 2007 | |
| INVENTOR(S) | : Shiang-Bau Wang et al. | |

It is certified that error appears in the above-identified patent and that said Letters Patent is hereby corrected as shown below:

Column 7, line 7, delete "forms aid" and insert -- "form said" -- therefor.

Column 7, line 24, delete "comparing second" and insert -- comparing said second -- therefor.

Column 7, line 41, delete "wavelength," and insert -- wavelength -- therefor.

Column 7, line 45, delete "wherein," and insert -- wherein -- therefor.

Column 8, line 52, delete "that during" and insert -- that changes during -- therefor.

Signed and Sealed this

Twenty Second Day of April, 2008

JON W. DUDAS
*Director of the United States Patent and Trademark Office*